(12) United States Patent
Chou et al.

(10) Patent No.: US 7,238,046 B2
(45) Date of Patent: Jul. 3, 2007

(54) POWER SUPPLY STACKED OUTPUT PORT STRUCTURE

(75) Inventors: Chin-Wen Chou, Taipei Hsien (TW); Tsun-Te Shih, Taipei Hsien (TW)

(73) Assignee: Zippy Technology Corp., Taipei Hsien (TW)

( * ) Notice: Subject to any disclaimer, the term of this patent is extended or adjusted under 35 U.S.C. 154(b) by 0 days.

(21) Appl. No.: 11/263,827

(22) Filed: Nov. 2, 2005

(65) Prior Publication Data
US 2007/0099451 A1    May 3, 2007

(51) Int. Cl.
*H01R 13/60* (2006.01)
(52) U.S. Cl. .................................. 439/541.5
(58) Field of Classification Search ............ 439/79, 439/540.1, 541.5
See application file for complete search history.

(56) References Cited
U.S. PATENT DOCUMENTS
6,077,114 A * 6/2000 Lu ........................... 439/541.5
6,733,328 B2 * 5/2004 Lin et al. ..................... 439/501
6,761,584 B2 * 7/2004 Li ............................ 439/540.1

FOREIGN PATENT DOCUMENTS
TW       M260929       4/2005

* cited by examiner

*Primary Examiner*—Ross Gushi
(74) *Attorney, Agent, or Firm*—Birch, Stewart, Kolasch & Birch, LLP

(57) ABSTRACT

A power supply stacked output port structure installed on a power output end of a power supply to integrate and output transformed DC power of a circuit board in the power supply. The structure includes a base output port which contains a first connector and a second connector that are arranged in a juxtaposed manner. A stacked output port is provided and horizontally located above the base output port that has at least a third connector. The third connector is electrically connected to the circuit board of the power supply through transmission lines. The stacked output port structure thus formed can increase the number of external equipment to be connected. The transmission lines used on the third connector can achieve more stable electric connection.

21 Claims, 4 Drawing Sheets

POWER SUPPLY STACKED OUTPUT PORT STRUCTURE

FIELD OF THE INVENTION

The present invention relates to a power supply output port structure and particularly to power supply output ports that adopts a stacked structure.

BACKGROUND OF THE INVENTION

In response to constant changes of Internet applications and multimedia functions, computer technologies also advance continuously. These days hardware such as hard disk drives, optical disk drives and disc burners have become the fundamental facilities for users or server providers. Power supply also has to provide a greater amount of output power to meet the growing demands. The basic power of 250 W in the past is not enough now. Nowadays, 450 W, 500 W or even 600 W is required to support all the computer hardware being used.

R.O.C patent No. M260929 discloses a power supply with power output ports on the rear end. The composite output ports include at least one AC power input end and one or more DC output port on a power supply host. Each DC power output port is coupled with a connector which has a plurality of power supply and signal terminals and at least one first conductive wire set connecting to the DC power output port. The conductive wire has a complementary connector on one end to be connected to the connector of the DC power output port. Another end has an output connector which has a pin number different from the complementary connector on the other end. There is at least one second conductive wire set corresponding and connecting to another DC power output port. One end of the conductive wire has another complementary connector to be connected to the connector of the DC power output port and another end has one or more output connector.

However, when the aforesaid patent has the connector serving for output purpose, due to the power supply adopted the commonly used 1 U specification has a maximum width of 100 mm and installation width of 92 mm for the connector, and the interval of the connector output pins is 2.54 mm, the maximum number of installable connector pins is 36. Converted to power (take 6 A for each common output pin as an example), the power supply can only output about 400 W. As the present requirement of power supply needs at least 500 W, the conventional techniques cannot meet this requirement. Hence how to increase power without changing the power supply specifications is a urgent issue remained to be resolved in the industry.

SUMMARY OF THE INVENTION

The primary object of the present invention is to solve the aforesaid disadvantages. The invention provides a power supply stacked output port structure installed on a power output end of a power supply to integrate and output the transformed DC power of a circuit board in the power supply. The stacked output port structure includes a base output port and a stacked output port to provide power output. The stacked output port is horizontally located above the base output port to increase the number of power output ports to supply power for more connecting external equipment.

Another object of the invention is to provide an improved wiring structure to enable the stacked output port above the base output port to be securely connected to the circuit board of the power supply. The stacked output port has a third connector equipped with power and signal terminals that are electrically connected to the circuit board through transmission lines. The transmission lines can protect the connection between the two without subject to external interference, therefore desired electric characteristics can be maintained.

Further scope of the applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE PREFERRED EMBODIMENTS

Figure 1:
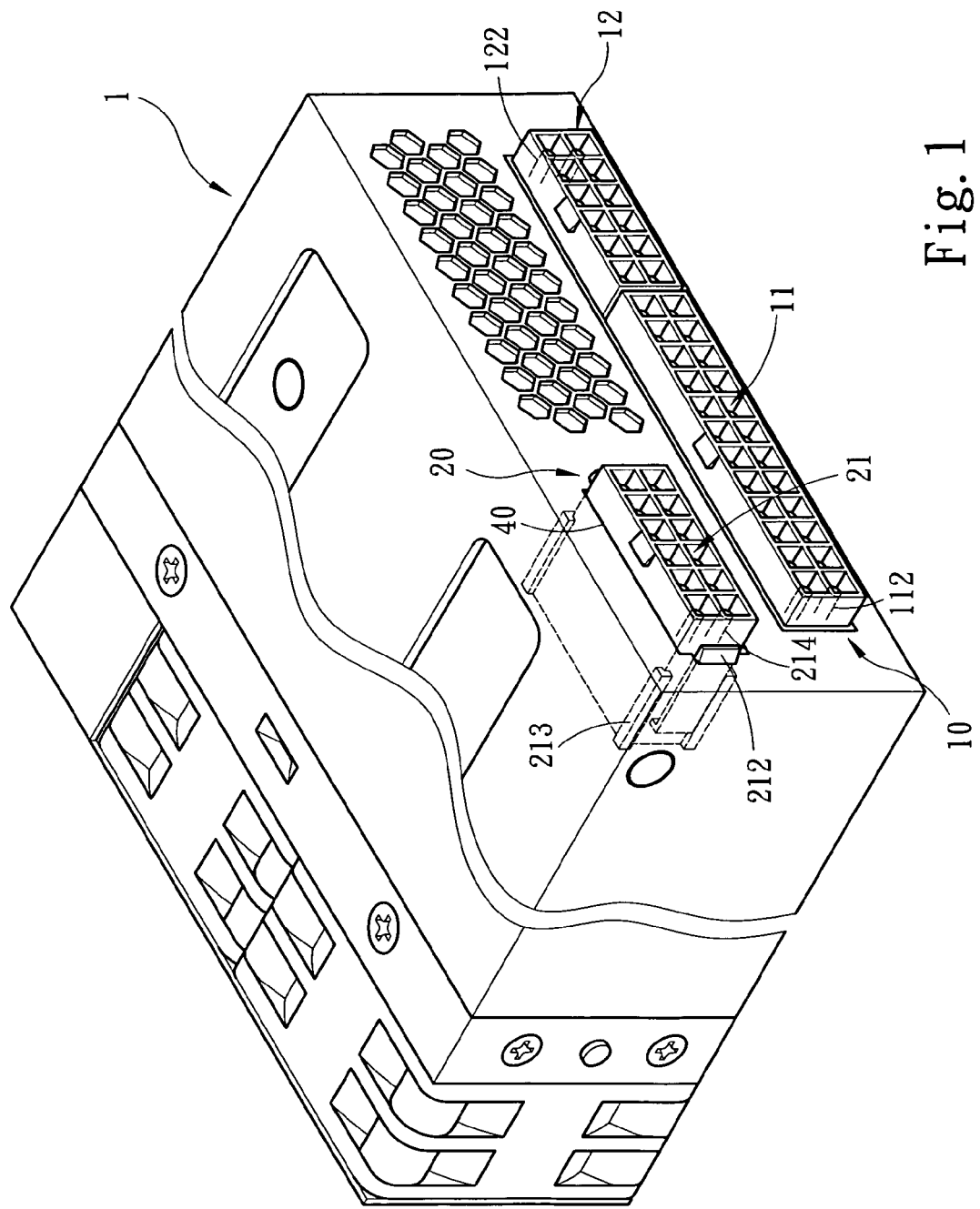
FIG. 1 is a perspective view of the present invention.
Figure 2:
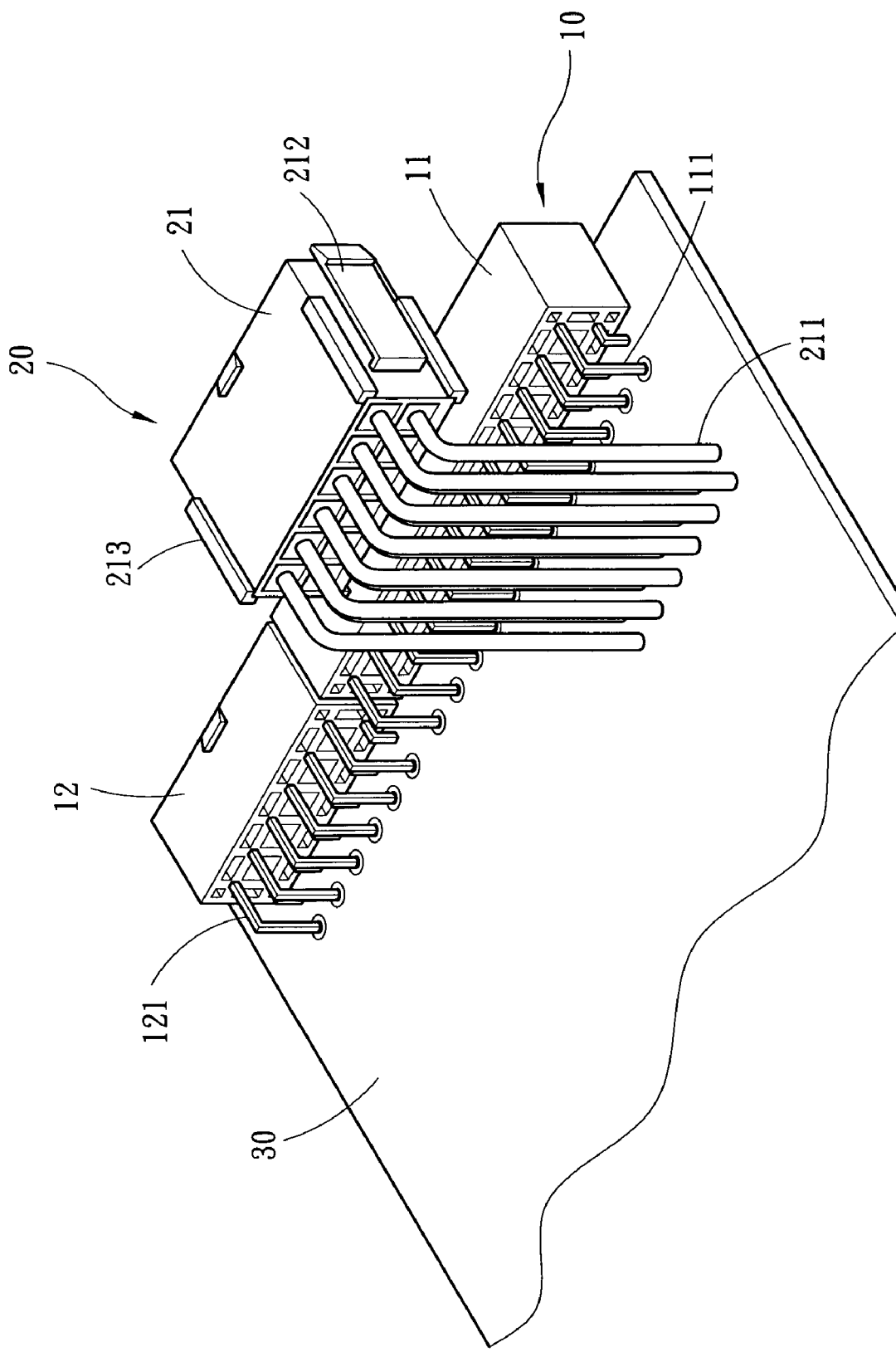
FIG. 2 is a fragmentary perspective view of the present invention.

Please referring to FIGS. 1 and 2, the power supply stacked output port structure according to the invention aims to be used on a power output end of a power supply 1 to integrate and output the transformed DC power of a circuit board 30 in the power supply 1. The structure includes a base output port 10 abutting the circuit board 30 that has at least a first connector 11 and a second connector 12 containing respectively first and second power and signal terminals 112 and 122 that are arranged in a juxtaposed manner. The first and second connectors 11 and 12 further have respectively first and second terminal pins 111 and 121 inserting into the circuit board 30 to form electric connection. There is a stacked output port 20 located horizontally above the base output port 10. The stacked output port 20 has at least a third connector 21 which contains third power and signal terminals 214. The third connector 21 is electrically connected to the circuit board 30 through transmission lines 211. The stacked output port 20 is spaced from the circuit board 30 at a longer distance, hence through connection of the transmission lines 211 the third power and signal terminals 214 can be coupled with external equipment (not shown in the drawings) to achieve desired electric effects.

Figure 3:
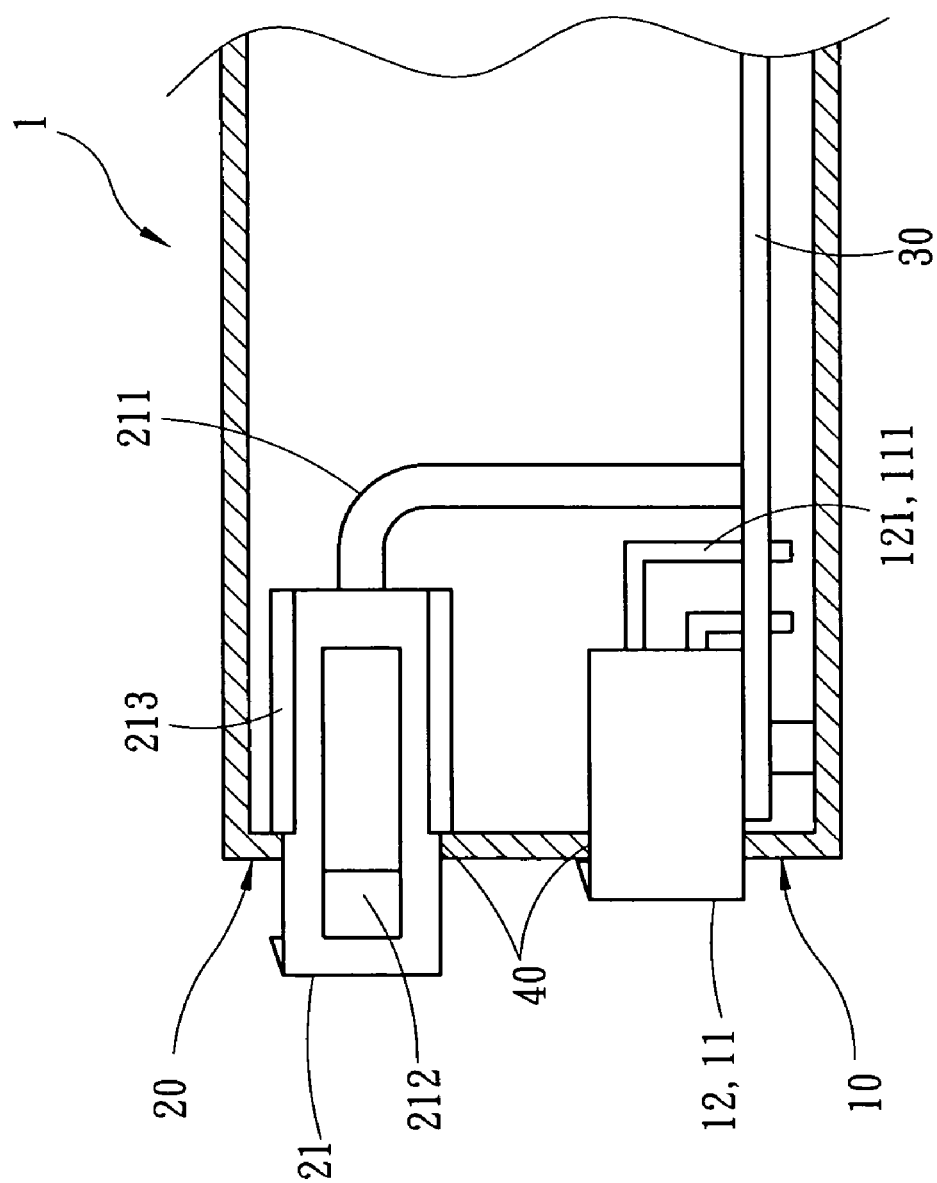
FIG. 3 is a sectional view of the present invention.

Also referring to FIG. 3, the base output port 10 and stacked output port 20 are held in openings 40 formed on the chassis of the power supply 1. The third connector 21 has two latch clips 212 on two sides to latch on one of the openings 40. The latch clips 212 have a maximum width which is greater than the width of the opening 40, therefore, when the third connector 21 passes through the opening 40, the maximum width of the latch clips 212 can be compressed to pass through the opening 40 because of its elasticity. The elasticity of the latch clip 212 allows it to return to its maximum width which is relatively bigger than the width of the opening 40, thus the latch clip 212 can get stuck within the opening 40 and the two sides of the latch clip 212 can be pressed against the chassis of the power supply 1. The third connector 21 further has latch portions 213 on the rest portions outside the latch clips 212 to be coupled with the interior of the power supply 1. Thereby the third connector 21 can be held firmly in the opening 40 without moving.

Figure 4:
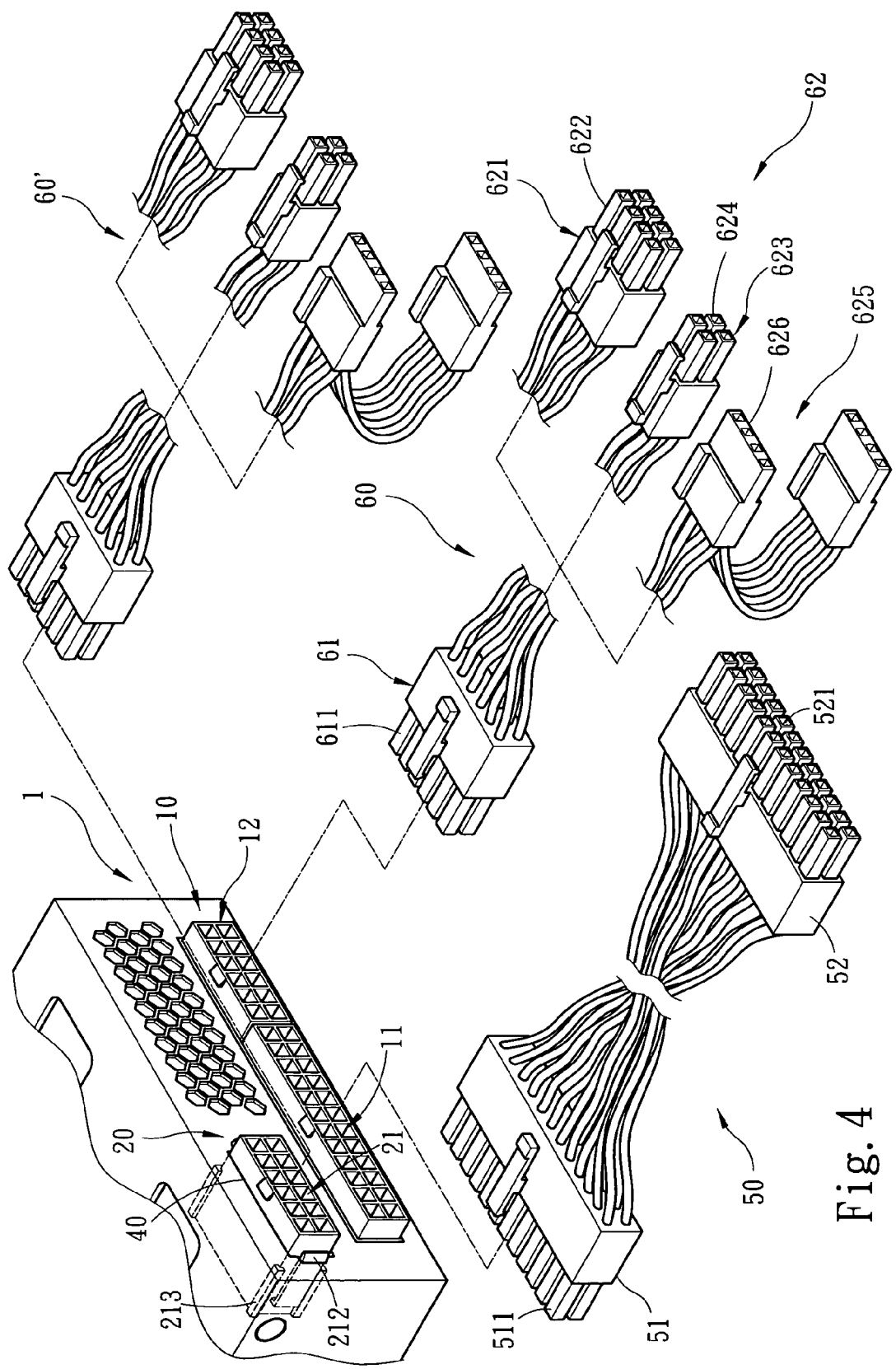
FIG. 4 is a schematic view of an embodiment of the present invention.

Refer to FIG. 4 for an embodiment of the invention. The first, second and third connectors 11, 12 and 21 are connected respectively to a first, second and third conductive wire sets 50, 60 and 60'. The first conductive wire set 50 has a first input connection end 51 to be coupled with the first connector 11. The number of pins on the first connection end 51 is same as the first connector 11. The first conductive wire set 50 has a first output connection end 52 on another end that has a pin number same as the first input connection end 51. As shown in the drawings, the first connector 11 has 24 first input pins 511, hence the first output connection end 52 of the first conductive wire set 50 also has the same number of first output pins 521. However, the number of the first output pins 521 may differ from the pin number of the first connector 11 according to different requirements of the external equipment. For instance, the first connector 11 and first input pins 511 on the first input connection end 51 may have 24 pins, while the first output pins 521 on the first output connection end 52 may be 20 (not shown in the drawings).

Similarly, the second conductive wire set 60 has a second input connection end 61 corresponding to the second connector 12. The second input connection end 61 has second input pins 611 at the same number as the second terminal pins 121 of the second connector 12. The second conductive wire set 60 has one or more second output connection end 62 on another end that contains second output pin 622 at a number not equal to the second input connection end 61. The second output connection end 62 includes second output pins 622, 624 and 626 to provide power for one or more external equipment. The second output connection end 62 may also be coupled with various types of connectors, such as a fourth connector 621 with four or eight pins. The four-pin connector may be formed like a fifth connector 623 with four smaller pins or a sixth connector 625 with four larger pins as shown in the drawing.

Referring to FIG. 3, the third connector 21 is same as the second connector 12 (but may also be different), and the corresponding third conductive wire set 60' may be same as the second conductive wire set 60. Similarly, a plurality and different types of output connection ends may be provided to connect to varying external equipment to provide required power supply.

While the preferred embodiments of the invention have been set forth for the purpose of disclosure, modifications of the disclosed embodiments of the invention as well as other embodiments thereof may occur to those skilled in the art. Accordingly, the appended claims are intended to cover all embodiments which do not depart from the spirit and scope of the invention.

What is claimed is:

1. A power supply stacked output port structure installed on a power output end of a power supply to integrate and output transformed DC power of a circuit board in the power supply, comprising:
   a base output port which has at least a first connector and a second connector that are arranged in a juxtaposed manner, the first and the second connectors having power and signal terminals and terminal pins inserting in the circuit board; and
   a stacked output port which is located horizontally above the base output port and has at least a third connector containing third power and signal terminals, and is electrically connected to the circuit board through transmission lines,
   wherein the power supply has an opening to hold the third connector, the third connector having two latch clips on two sides to pass through the opening to form a latch coupling.

2. The power supply stacked output port structure of claim 1, wherein the third connector has latch portions outside the latch clips to be coupled with the interior of the power supply.

3. The power supply stacked output port structure of claim 1, wherein the first connector is connected to a corresponding first conductive wire set, the first conductive wire set having a first input connection end which has first input pins at a number equal to the number of the terminals of the first connector and a first output connection end on another end that has first output pins at a number equal to the first input pins of the first input connection end.

4. The power supply stacked output port structure of claim 3, wherein the first connector, the first input connection end and the first output connection end have respectively twenty four pins.

5. The power supply stacked output port structure of clam 1, wherein the first connector is connected to a corresponding first conductive wire set the first conductive wire set having a first input connection end which has first input pins at a number equal to the number of the terminals of the first connector and a first output connection end on another end that has first output pins at a number not equal to the first input pins of the first input connection end.

6. The power supply stacked output port structure of claim 5, wherein the first connector and the first input connection end have respectively twenty four pins, and the first output connection end has twenty pins.

7. The power supply stacked output port structure of claim 1, wherein the second connector is connected to a corresponding second conductive wire set, the second conductive wire set having a second input connection end which has second input pins at a number equal to the number of the terminals of the second connector, and at least one second output connection end on another end that has second output pins at a number not equal to the number of the second input pins of the second input connection end.

8. The power supply stacked output port structure of claim 7, wherein the second output connection end includes connectors which have four pins and eight pins.

9. The power supply stacked output port structure of claim 7, wherein the second output connection end includes connectors which have four small pins and four large pins.

10. The power supply stacked output port structure of claim 1, wherein the third connector is connected to a corresponding third conductive wire set, the third conductive wire set having a third input connection end which has third input pins at a number equal to the number of the terminals of the third connector, and at least one third output connection end on another end that has third output pins at a number not equal to the number of the third input pins of the third input connection end.

11. The power supply stacked output port structure of claim 10, wherein the third output connection end includes connectors which have four pins and eight pins.

12. The power supply stacked output port structure of claim 10, wherein the third output connection end includes connectors which have four small pins and four large pins.

13. A power supply stacked output port structure installed on a power output end of a power supply to integrate and output transformed DC power of a circuit board in the power supply, comprising:
- a base output port which has at least a first connector and a second connector that are arranged in a juxtaposed manner, the first and the second connectors having power and signal terminals and terminal pins inserting in the circuit board; and
- a stacked output port which is located horizontally above the base output port and has at least a third connector containing third power and signal terminals, and is electrically connected to the circuit board through transmission lines,
- wherein the first connector is connected to a corresponding first conductive wire set, the first conductive wire set having a first input connection end which has first input pins at a number equal to the number of the terminals of the first connector and a first output connection end on another end that has first output pins at a number equal to the first input pins of the first input connection end, and
- wherein the first connector, the first input connection end and the first output connection end have respectively twenty four pins.

14. The power supply stacked output port structure of claim 13, wherein the power supply has an opening to hold the third connector, the third connector having two latch clips on two sides to pass through the opening to form a latch coupling.

15. The power supply stacked output port structure of claim 13, wherein the third connector has latch portions outside the latch clips to be coupled with the interior of the power supply.

16. The power supply stacked output port structure of claim 13, wherein the second connector is connected to a corresponding second conductive wire set, the second conductive wire set having a second input connection end which has second input pins at a number equal to the number of the terminals of the second connector, and at least one second output connection end on another end that has second output pins at a number not equal to the number of the second input pins of the second input connection end.

17. The power supply stacked output port structure of claim 16, wherein the second output connection end includes connectors which have four pins and eight pins.

18. The power supply stacked output port structure of claim 16, wherein the second output connection end includes connectors which have four small pins and four large pins.

19. The power supply stacked output port structure of claim 13, wherein the third connector is connected to a corresponding third conductive wire set, the third conductive wire set having a third input connection end which has third input pins at a number equal to the number of the terminals of the third connector, and at least one third output connection end on another end that has third output pins at a number not equal to the number of the third input pins of the third input connection end.

20. The power supply stacked output port structure of claim 19, wherein the third output connection end includes connectors which have four pins and eight pins.

21. The power supply stacked output port structure of claim 19, wherein the third output connection end includes connectors which have four small pins and four large pins.

* * * * *